May 8, 1962 | ALFONSO ACOSTA-LLERAS | 3,033,914

PRINTED CIRCUIT BOARDS

Filed April 20, 1960

Inventor:
Alfonso Acosta-Lleras,
by Albert S. Richardson Jr.
Attorney.

United States Patent Office 3,033,914

Patented May 8, 1962

3,033,914

PRINTED CIRCUIT BOARDS

Alfonso Acosta-Lleras, Bogota, Colombia, assignor to General Electric Company, a corporation of New York Filed Apr. 20, 1960, Ser. No. 23,542
2 Claims. (Cl. 174—68.5)

This invention relates to printed circuit boards and in particular to a printed circuit board of universal utilization.

A printed circuit board, as is well known to those skilled in the art, is a card or sheet of electric insulating material suitable for physically mounting and electrically interconnecting the components or elements, such as transistors, resistors, capacitors and the like, of an electric circuit. The means for electrically interconnecting such circuit components comprise narrow paths of electroconductive material permanently affixed to the surface of the insulating card by any one of several well known processes. These conductive paths serve as conductors for interconnecting appropriate terminals of circuit components which are to be mounted on the printed circuit board, and the whole then comprises a functionally integrated assembly or sub-assembly in an electric device.

It has been the usual practice in the printed circuit board art to design for each new or modified electric circuit a different board with its own unique, sometimes complicated pattern of conductors tailored specifically to provide the desired interconnections among the circuit components which are mounted in predetermined positions on the board. Whereas the complexity of the pattern of conductors on a printed circuit board does not adversely affect its manufacturing cost, the conventional processes for making such boards are not economically attractive unless large quantities of each different board are to be produced.

Most applications of printed circuit boards involve large-quantity production, and therefore the above-mentioned usual practice of designing a different board to suit each given electric circuit and component configuration is generally satisfactory. However, in some applications of printed circuit boards there is only relatively limited demand for a given electric circuit, and to design a different board for each such circuit is uneconomical due to the small quantities needed. Accordingly, it is an object of the present invention to provide a printed circuit board capable of being manufactured in large quantities and being used for a plurality of different electric circuit designs.

It is also an object of this invention to provide a standard printed circuit board having conductors arranged thereon in an extremely compact pattern and designed for convenient utilization in a wide variety of alternative circumstances.

Another object of the invention is the provision of an improved printed circuit board which need not be changed every time a modification or change is made in the electric circuit which it carries.

Briefly stated, in carrying out the invention in one form, I provide an insulating board on which a series of conductors are arranged in a simple pattern of straight parallel lines. Each conductor includes enlargements at longitudinally spaced intervals connected by relatively narrow portions of the conductor, and adjacent conductors are offset longitudinally so that the enlargements of one are in transverse alignment with the narrow portions of the other. A variety of electric components can be physically supported and electrically interconnected by this printed circuit board, with the component terminals being conductively attached to preselected enlargements for interconnection by the conductors. To facilitate the utilization of the printed circuit board in this manner, I provide drill-centering means comprising small guide holes in all of the conductor enlargements.

The invention will be better understood from the following description taken in connection with the accompanying drawing. The scope of the invention will be pointed out in the concluding claims.

Figure 1:
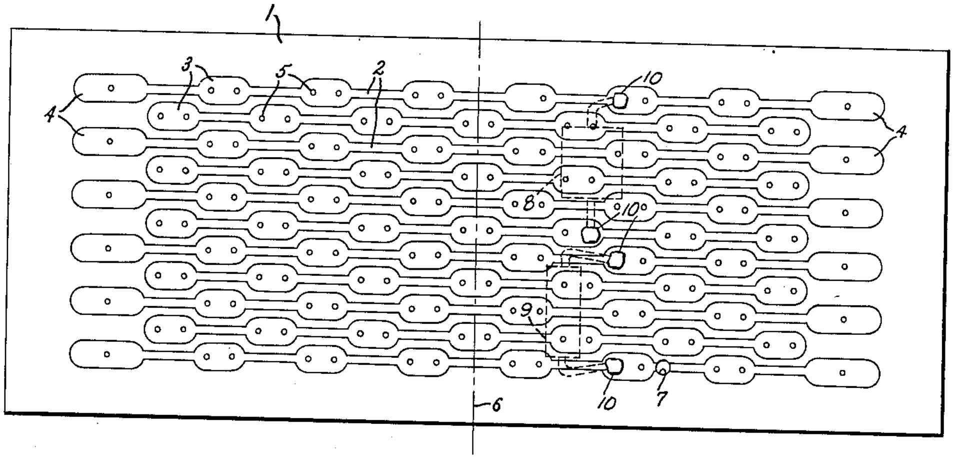
FIG. 1 is a plan view of an embodiment of a printed circuit board according to the present invention.

Referring now to FIG. 1 of the drawing, an insulating board or sheet 1 is provided with a plurality of electroconductive paths or conductors 2 printed thereon. It is evident that the conductors may be formed or fastened on the board by any of several well known methods instead of being actually "printed" and the term "printed circuit" is used with reference to the type of product rather than its method of manufacture. In accordance with the invention the centerlines of the conductors are substantially parallel along their lengths, and they are spaced at equal intervals across the width of the sheet 1. While the longitudinal centerlines are shown as parallel straight lines, a curved or serpentine or other similar arrangement of conductors with their respective centerlines substantially parallel is also considered to be within the scope of this invention.

In order to provide adequate area for connecting circuit components to the conductors 2 of the printed circuit board, each conductor is enlarged at spaced-apart intervals along its length. These enlargements, such as shown at 3, may take different shapes as long as they fulfill their function. This function is to provide sufficient conducting material so that holes can be drilled for the electrical connection of circuit components without destroying the continuity of the conductor. Whereas it has been found desirable to make the enlargements long enough so that two connections can be made thereto, it is evident that the number of connections to be made at each enlargement can be varied according to requirements without departing from the spirit of this invention.

Each of the enlargements 3 in FIG. 1 has an oblong shape, with its long sides being parallel to the centerline of the conductor and with its short sides providing curved transistions to the adjoining conductor portions of reduced width. As can be seen, adjacent conductors are longitudinally staggered or offset so that the enlargements of each conductor are disposed in transverse alignment with the reduced portions of the conductors adjacent thereto. By this "meshing" design the minimum insulation clearances and connection area requirements are both met, while the total space on the printed circuit board is used most efficiently. As the drawing reveals, almost the entire area of the board is covered with this compact arrangement of conductors, with a substantially constant width of insulation being maintained between adjacent conductors.

The printed circuit board of this invention is particularly useful for mounting and interconnecting circuit components to form a relatively small sub-circuit which is part of a larger unit or electric device. To this end the board is adapted to be plugged in at its end. Somewhat longer enlargements or terminals 4 are therefore provided on alternate conductors at each end, and these can be used to make contact with appropriate conductors in a receptacle not part of this invention.

It has been found helpful to provide small guide or pin holes 5 in the enlargements 3 as shown. These guide holes may be formed in the conductor only, and they are used to center the drill that would be used to bore connection holes at the proper points where desired. It is evident that while these guide holes are shown as being located on the centerline of the conductors, they could be placed elsewhere if desired without departing from the spirit of the invention.

Figure 2:
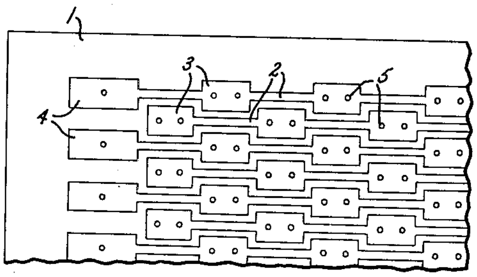
FIG. 2 is a partial plan view of a modification of the invention.

Referring next to FIG. 2, the same numerals used in describing FIG. 1 indicate the corresponding elements in this embodiment of the printed circuit board. In FIG. 2, however, the enlargements 3 have a rectangular shape.

The printed circuit board described above is suitable for the mounting and interconnection of multi-terminal electric components of many different electric circuits. The parallel strips 2 of conductive material on the board correspond to nodes of the circuit. In order to have any one of the conductors serve as more than one node, it is only necessary to break the continuity of that conductor by drilling completely through the reduced width portion thereof. In other words, each of the conductors 2 can be divided into electrically separate sections by severing the conductive material at one or more points along its length, as is shown at 7 in FIG. 1. On the other hand, a single node can be formed of more than one of the parallel conductors, or sections thereof, simply by interconnecting different conductor sections with wire junmpers (not shown). In practice, the terminals of each circuit component which is fixedly mounted on the printed circuit board are connected to the appropriate conductor (or section thereof) just as the leads of the component are drawn to nodes on the schematic circuit diagram. The arrangement of such connections determines the physical arrangement of the components on the board.

The actual connection between each terminal and its proper conductor may be made by inserting a pin-like terminal of the component in a hole drilled in one of the enlargements 3 of the conductor and applying solder around the terminal and over the enlargement. This is indicated, by way of example, in FIG. 1 where the reference numerals 8 and 9 identify two typical electric components mounted on my printed circuit board. The components 8 and 9 are representative of transistors, resistors, capacitors, diodes or the like. While they are shown mounted on the back of the board, if desired they could instead be located on the conductor side. After drilling holes into preselected enlargements 3 of the conductors 2 and on through the insulating board 1, pin-like terminals of the components 8 and 9 are inserted through the holes for attachment to the conductors by means of solder 10. Modifications in the electric circuit, after the circuit components and the printed circuit board have been assembled, can be conveniently made by appropriately reconnecting the component terminals to other conductor sections which are provided on the board. Thus it is unnecessary to completely redesign the printed circuit board following any slight modification or change of the circuit.

Manufacturing costs for the illustrated printed circuit board can be minimized by fabricating the board in long sheets from which pieces of the required size can be cut. For example, the board shown in FIG. 1 could be cut at any point between its ends, such as at 6, to form two boards therefrom.

While particular embodiments of my printed circuit board have been shown and described, it will be obvious that changes or modifications may be made without departing from the invention, and the concluding claims are intended to cover all such changes and modifications as fall within the true spirit and scope of the invention.

What I claim as new and desire to secure by Letters Patent of the United States is:

1. A printed circuit board comprising an imperforate insulating board and a plurality of conductors affixed to the surface of said board in parallel relationship along their entire lengths, said conductors being enlarged at spaced intervals with the enlargements of adjacent conductors being longitudinally offset and being dimensioned so as to leave a substantially constant width of insulating material between adjacent conductors, said conductors having guide holes located in the enlargements to aid in positioning a drill for boring holes in preselected enlargements and through said insulating board in order to accommodate pin-like terminals of electric components mounted on the printed circuit board for electrical interconnection by means of said conductors, and alternate conductors having a terminal enlargement at one end of the board.

2. In a printed circuit board adapted for fixedly mounting multi-terminal electrical components: an imperforate insulating board, and a plurality of conductors affixed to the surface of said board and having their centerlines substantially parallel to each other along their lengths, each of said conductors having successive portions of alternately enlarged and reduced width and being disposed in relation to adjacent conductors so that the enlarged portions thereof are aligned transversely with reduced portions of the adjacent conductors, said enlarged portions being constructed and arranged to accommodate the terminals of the electric components when mounted on the board and being provided, for this purpose, with guide holes to facilitate centering a drill for boring holes in preselected enlargements and through said insulating board for receiving the component terminals.

References Cited in the file of this patent

UNITED STATES PATENTS

| | | |
|---|---|---|
| 2,799,837 | Powell | July 16, 1957 |
| 2,883,447 | Dahl | Apr. 12, 1959 |
| 2,929,042 | Guttridge et al. | Mar. 15, 1960 |
| 2,929,965 | Oden | Mar. 22, 1960 |